(12) United States Patent
Han et al.

(10) Patent No.: US 8,871,612 B2
(45) Date of Patent: Oct. 28, 2014

(54) METHOD FOR FORMING A CLEAVED FACET OF SEMICONDUCTOR DEVICE

(75) Inventors: Young Hun Han, Seoul (KR); Dong Han Yoo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 289 days.

(21) Appl. No.: 13/440,640

(22) Filed: Apr. 5, 2012

(65) Prior Publication Data

US 2013/0217209 A1    Aug. 22, 2013

(30) Foreign Application Priority Data

Feb. 16, 2012  (KR) .................. 10-2012-0015985

(51) Int. Cl.
*H01L 21/301* (2006.01)

(52) U.S. Cl.
USPC ........................................................ 438/462

(58) Field of Classification Search
CPC ........................................................ H01L 33/07
USPC ................................................ 438/432, 462
See application file for complete search history.

(56) References Cited

U.S. PATENT DOCUMENTS

| | | | |
|---|---|---|---|
| 6,379,985 B1* | 4/2002 | Cervantes et al. | 438/33 |
| 8,242,513 B2* | 8/2012 | Ohmae et al. | 257/79 |
| 2010/0265981 A1* | 10/2010 | Hiroyama et al. | 372/49.01 |
| 2011/0007766 A1* | 1/2011 | Farrell et al. | 372/45.01 |
| 2013/0217209 A1* | 8/2013 | Han et al. | 438/462 |

* cited by examiner

*Primary Examiner* — George Fourson, III
(74) *Attorney, Agent, or Firm* — KED & Associates, LLP (57) ABSTRACT

Embodiments disclose a method including forming at least one compound semiconductor layer on a top r-face of a substrate, forming a line for cleavage on a bottom r-face of the substrate along a length of a guide line, wherein the guide line extends in a (11-22)-plane direction of the substrate, wherein the guide line extends from one portion of an edge to another portion of the edge, and wherein the edge is disposed between the top r-face and the bottom r-face of the substrate, and applying a force to the bottom r-face of the substrate to cleave the substrate along the line for cleavage in the (11-22)-plane direction and to form a cleaved facet along a c-plane of the at least one compound semiconductor.

15 Claims, 6 Drawing Sheets

METHOD FOR FORMING A CLEAVED FACET OF SEMICONDUCTOR DEVICE

CROSS REFERENCE TO RELATED APPLICATION

This application claims priority under 35 U.S.C. §119 to Korea Application No. 10-2012-0015985 filed in Korea on 16 Feb. 2012 which is hereby incorporated in its entirety by reference as if fully set forth herein.

TECHNICAL FIELD

Embodiments relate to a method for forming a cleaved facet of semiconductor device.

BACKGROUND

Semiconductor devices such as high-efficiency light emitting devices based on group III-V nitride compound semiconductor have sufficiently wide band-gaps for short-wavelength and visible light emission. In fabricating light emitting diodes or semiconductor lasers, multi-layer binary or ternary III-V nitride compound semiconductor, such as, for example, GaN, AlGaN, and GaInN are laminated and light emitting layer may be disposed between a P type cladding layer and an N type cladding layer. Especially, when fabricating the semiconductor laser, generally the facet through which light is emitted is formed by a cleavage.

SiC is a mainly used substrate material for growing a GaN compound semiconductor. The SiC substrate having (0001)-plane is expensive. Or, sapphire is a commonly used substrate material for growing a GaN compound semiconductor. The sapphire substrate is cheaper than the SiC substrate.

In point of industrial view, the cheap sapphire substrate is preferable for realizing a GaN semiconductor laser. However, a mainly used (0001)-plane sapphire substrate doesn't have any cleaved axis in the plane. Thus, in case that the substrate is cleaved after growing GaN compound semiconductor layer for laser structure on the sapphire substrate, a satisfactory facet through which light is emitted may not be formed. Namely, although the sapphire substrate is easily cleaved, the substrate is not practically satisfied. Further, the cleaved facet through which the light is emitted is uneven, thereby causing the light scattering.

SUMMARY OF THE DISCLOSURE

An embodiment is to provide a method for forming a cleaved facet of a semiconductor device.

In one embodiment, a method includes forming at least one compound semiconductor layer on a top r-face of a substrate, forming a line for cleavage on a bottom r-face of the substrate along a length of a guide line, wherein the guide line extends in a (11-22)-plane direction of the substrate, wherein the guide line extends from one portion of an edge to another portion of the edge, and wherein the edge is disposed between the top r-face and the bottom r-face of the substrate, and applying a force to the bottom r-face of the substrate to cleave the substrate along the line for cleavage in the (11-22)-plane direction and to form a cleaved facet along a c-plane of the at least one compound semiconductor.

And, the forming of the line for cleavage includes weakening the bottom r-face of the substrate in the (11-22)-plane direction of the substrate, the line for cleavage being formed on the bottom r-face of the substrate.

The line for cleavage is formed by scribing the bottom r-face of the substrate in the (11-22)-plane direction of the substrate.

The line for cleavage is formed by ablating the bottom r-face of the substrate in the (11-22)-plane direction of the substrate.

The line for cleavage is formed by etching the bottom r-face of the substrate in the (11-22)-plane direction of the substrate.

In another embodiment, a method includes forming at least one compound semiconductor layer on a top r-face of a substrate, forming a line for cleavage on a top surface of the at least one compound semiconductor layer along a length of a guide line, wherein the guide line extends in a c-plane direction of the at least one compound semiconductor layer, wherein the guide line extends from one portion of an edge to another portion of the edge, and wherein the edge is disposed between the top surface and the bottom surface of the at least one compound semiconductor layer, and applying a force to the top surface of the at least one compound semiconductor layer to form a cleaved facet by cleaving the at least one compound semiconductor layer along the line for cleavage in the c-plane direction of the at least one compound semiconductor layer and to cleave the substrate along a (11-22)-plane of the substrate.

The forming the line for cleavage includes weakening the top surface of the at least one compound semiconductor in the c-plane direction of the at least one compound semiconductor layer, the line for cleavage being formed on the top surface of the at least one compound semiconductor layer.

The line for cleavage is formed by scribing the top surface of the at least one compound semiconductor layer in the c-plane direction of the at least one compound semiconductor layer.

The line for cleavage is formed by ablating the top surface of the at least one compound semiconductor layer in the c-plane direction of the at least one compound semiconductor layer.

The line for cleavage is formed by etching the top surface of the at least one compound semiconductor layer in the c-plane direction of the at least one compound semiconductor layer.

The substrate is a sapphire substrate or spinel substrate.

The substrate has a thickness of 0.0001 to 300 μm. The at least one compound semiconductor layer includes a group III-V nitride compound semiconductor.

The at least one compound semiconductor layer has at least one diode laser structure.

The at least one compound semiconductor layer has at least one light emitting diode structure.

The at least one compound semiconductor layer is grown on the top r-face of the substrate in a direction perpendicular to a a-plane of the at least one compound semiconductor layer.

The cleaved facet is formed on the at least one compound semiconductor layer in a direction perpendicular to the top r-face of the substrate.

The line for cleavage is formed along an entire length or along at least 95% of the entire length of the guide line.

The at least one compound semiconductor layer has an rms roughness of 0.0001 to 200 Å.

The at least one compound semiconductor layer and the substrate are simultaneously or sequentially cleaved.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be made without departing from the spirit and scope of the present invention. The following detailed description is, therefore, not to be taken in a limiting sense, and the scope of the present invention is defined by the appended claims and their equivalents.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

In the drawings, the thicknesses or sizes of respective components may be exaggerated, omitted or schematically illustrated for convenience and clarity of description.

Hereinafter, a method for forming a cleaved facet of semiconductor device in accordance with embodiments will be described with the attached drawings.

Figure 1:
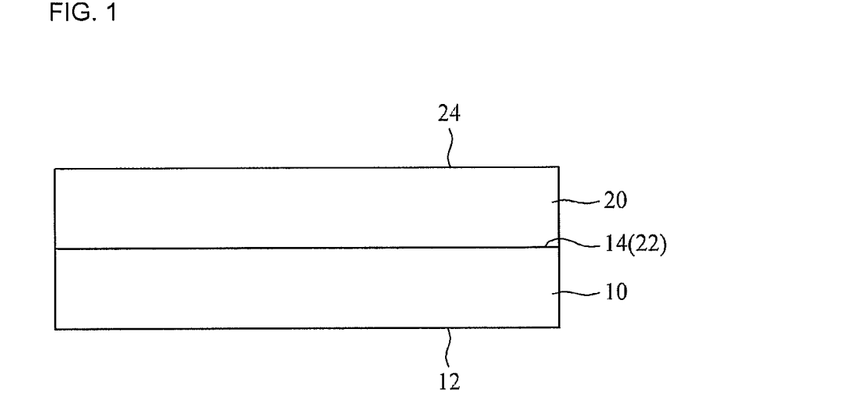
FIG. 1 is a cross-sectional view of a cleaved substrate and a cleaved at least one compound semiconductor layer in accordance with one embodiment.

FIG. 1 is a cross-sectional view of a cleaved substrate 10 and a cleaved at least one compound semiconductor layer 20 in accordance with one embodiment.

The substrate 10 may be a sapphire substrate or a spinel substrate.

Hereinafter, although the substrate 10 exemplarily illustrates the sapphire substrate, the substrate 10 is not limited thereto and may be formed of various materials.

The sapphire substrate 10 may have a thickness of from about 0.0001 μm to about 300 μm. Reducing the thickness of the sapphire substrate 10 may make the substrate 10 easier to cleave. For example, the sapphire substrate 10 may have a thickness of less than about 150 μm.

The sapphire substrate 10 may be thinned by any suitable technique to achieve the desired thickness and also a sufficiently smooth surface on the r-face of the sapphire substrate 10. For example, the sapphire substrate 10 may be rough polished and then fine polished with a fine grid, such as a 0.1 μm polish grid. The polishing process also ensures that the top r-face 14 and the bottom r-face 12 of the sapphire substrate 10 are sufficiently parallel to each other, and that the top r-face 14 of the sapphire substrate 10 may be at least substantially perpendicular to the (11-22)-plane of the sapphire substrate 10.

Figure 2:
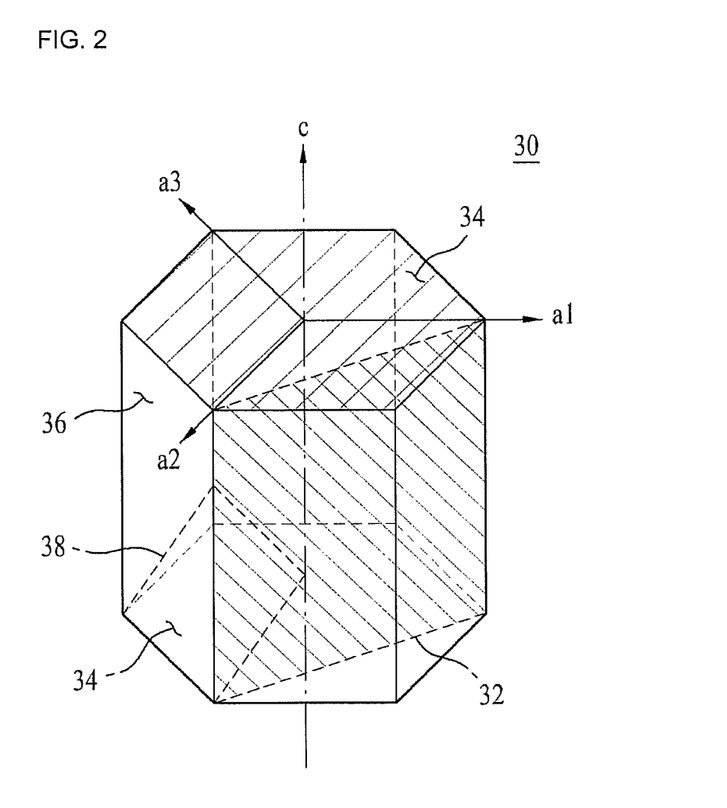
FIG. 2 illustrates the crystalline structure of sapphire.

FIG. 2 illustrates the crystalline structure of sapphire.

The unit cell 30 of the sapphire substrate 10 has a hexagonal crystal structure. The location and orientation of an a-plane 32, c-planes 34, an m-plane 36 and an r-plane 38 in the sapphire unit cell 30 are shown in FIG. 2. The a-plane 32 has (11-20) orientations. The c-planes 34 form top and bottom surfaces of the sapphire unit cell 30 and have (0001) orientations. The a-plane 32 is perpendicular to the c-planes 34. The m-plane 36 form side surfaces of the sapphire unit cell 30 and have (1-100) orientations. The r-plane 38 is oriented at an angle of 57.6° with respect to the c-planes 34.

Referring to FIGS. 1 and 2, at least one compound semiconductor layer 20 is formed on a top r-face 14 of the sapphire substrate 10, for example, by epitaxial growth. The at least one compound semiconductor layer 20 may be grown on the top r-face 14 of the sapphire substrate 10 in the direction perpendicular to an a-plane of the at least one compound semiconductor layer 20.

The at least one compound semiconductor layer 20 may have a light emitting device structure. For example, the light emitting device may include diode lasers, as well as other types of semiconductor devices including light emitting diodes (LEDs).

The compound semiconductor layer 20 may be formed of a compound semiconductor, especially, of a group III-V nitride compound semiconductor. Here, the group III-V nitride compound semiconductor is advantageous for forming short-wavelength and light emitting devices and has various characteristics. The Al—Ga—In—N system has a large band-gap, which covers the entire visible spectrum.

For example, the compound semiconductor layer 20 may be formed of a semiconductor material having composition of $Al_xIn_yGa_{(1-x-y)}N$ ($0 \leq x \leq 1$, $0 \leq y \leq 1$, $0 \leq x+y \leq 1$), or at least one selected from GaN, InN, AlN, InGaN, AlGaN, InAlGaN, AlInN, AlGaAs, InGaAs, AlInGaAs, GaP, AlGaP, InGaP, AlInGaP, and InP.

Figure 3:
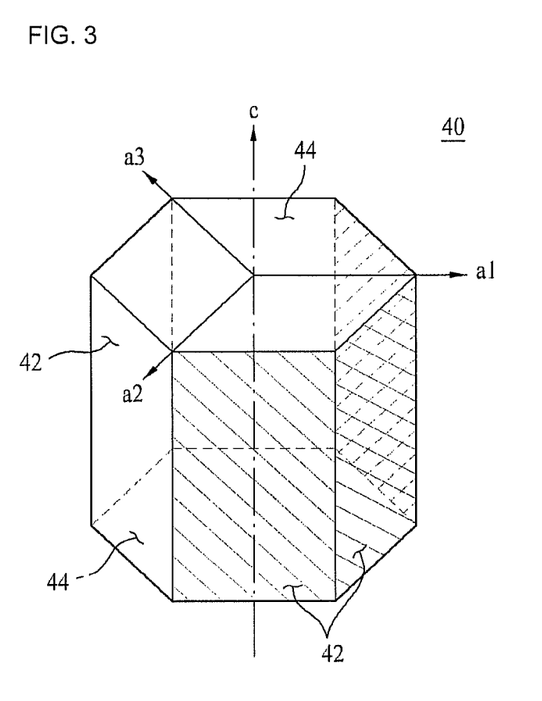
FIG. 3 illustrates the crystalline structure of GaN.

FIG. 3 illustrates the crystalline structure of GaN.

In accordance with an embodiment, GaN may be used as the at least one compound semiconductor layer 20. The unit cell 40 of GaN has a hexagonal crystal structure. Referring to FIG. 3, the unit cell 40 of GaN includes m-planes 42 forming side faces, and c-planes 44 forming top and bottom surfaces.

Figure 4A:
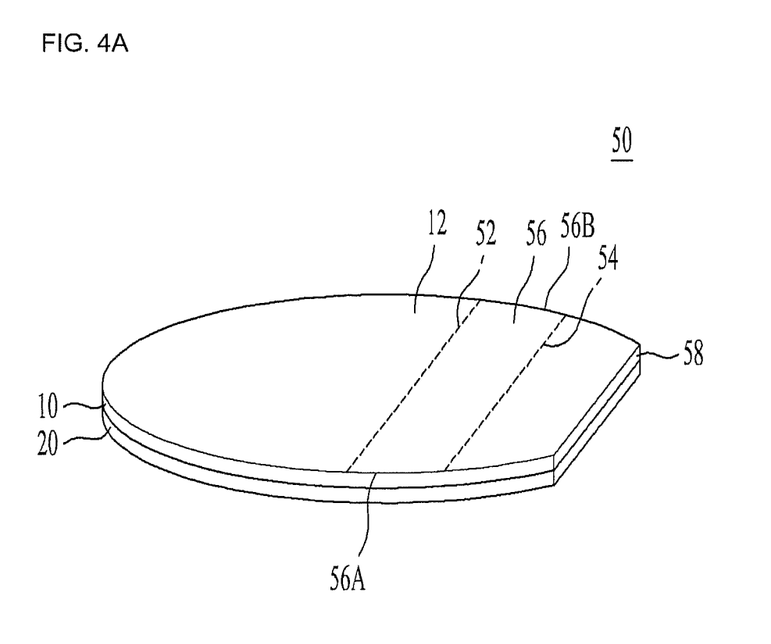
FIGS. 4A to 4C illustrate the drawings for explaining the method for forming a cleaved facet of the semiconductor device in accordance with an embodiment.
Figure 4B:
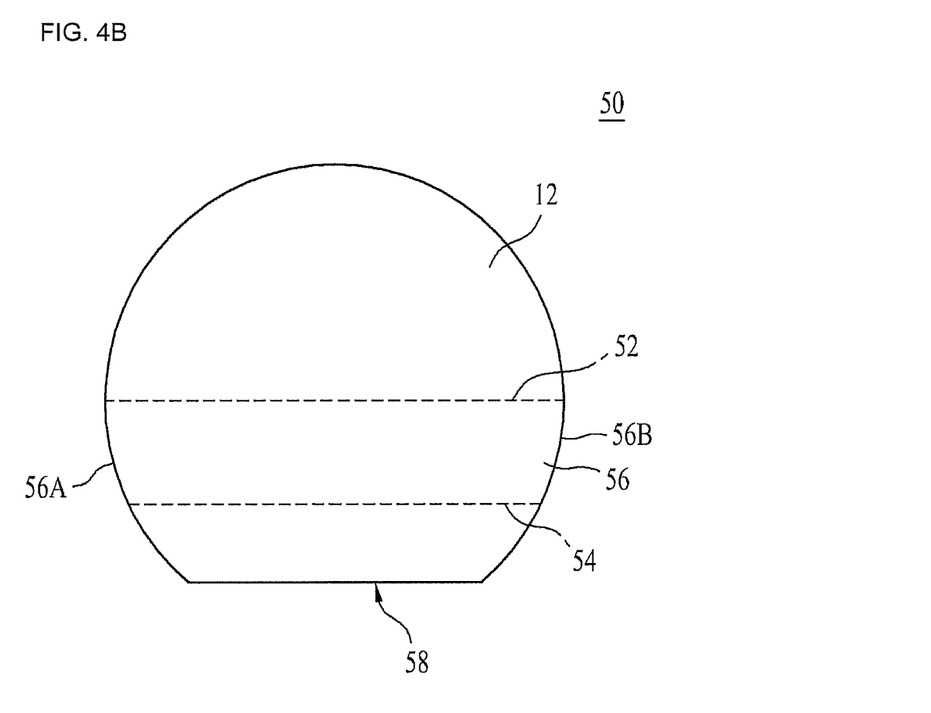
Figure 4C:
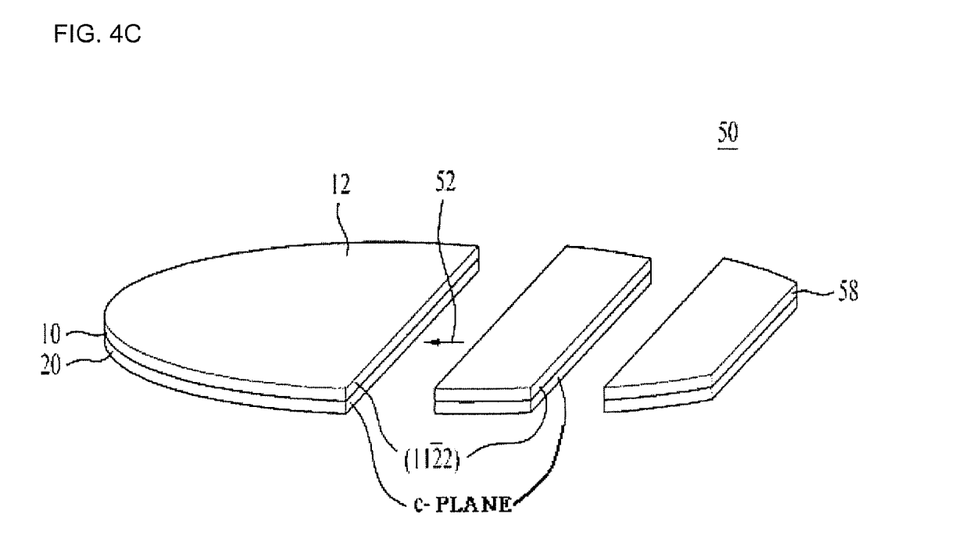

FIGS. 4A to 4C illustrate the drawings for explaining the method for forming a cleaved facet of the semiconductor device 50 in accordance with an embodiment. In detail, FIG. 4A illustrate a perspective view of a semiconductor device 50 in which lines for cleavage 52, 54 are formed. FIG. 4B illustrates a plan view of r-face sapphire substrate 10 in the semiconductor device 50 in which lines for cleavage 52, 54 are formed. FIG. 4C a perspective view of the semiconductor device 50 cleaved along the lines for cleavage 52, 54.

FIG. 1 is a cross-sectional view of the semiconductor device 50 when the semiconductor device 50 of FIG. 4C is turned over and seen from the arrow 52. The semiconductor device 50 used in embodiments of this invention may have other shapes such as polygon shapes as well as the circular shape shown in FIGS. 4A to 4C, and include the (11-22)-plane flat 58.

In accordance with an embodiment, referring to FIGS. 1, 4A, and 4B, lines for cleavage 52, 54 are formed along a length of a guide line on a bottom r-face 12 of the sapphire substrate 10. Here, the guide line means a line extending in the (11-22)-plane direction of the sapphire substrate 10. Also, the guide line means a line extending from one portion 56A of an edge 56 to another portion 56B of the edge 56, the edge 56 being disposed between the top r-face 14 and the bottom r-face 12 of the substrate 10. In embodiments, the lines for cleavage 52, 54 (as well as other lines for cleavage that are not shown) may extend at least about 95% of an entire length of the guide line, the entire length being the distance between opposed portions 56A, 56B of the edge 56 of the sapphire substrate 10. Alternatively, the lines for cleavage 52, 54 may extend the entire distance between opposed portions 56A, 56B of the edge 56 of the sapphire substrate 10, as shown in FIGS. 4A and 4B.

If the sapphire substrate 10 may have a circular configuration and a diameter as shown in FIGS. 4A and 4B, the line for cleavage 52 extends substantially the entire diameter of the sapphire substrate 10. And, the line for cleavage 54 may extend parallel to the line for cleavage 52 and have a length that is less than the diameter of the sapphire substrate 10.

Alternatively, if the sapphire substrate 10 has a polygon shape, unlike the circular shape as shown in FIGS. 4A and 4B, the sapphire substrate 10 has any edge 56. In this case, the lines for cleavage 52, 54 may extend from one portion of an edge to another portion of the edge of the sapphire substrate 10 in a (11-22)-plane direction. For a rectangular-shaped sapphire substrate 10 having short sides parallel to the (11-22)-plane, a plurality of lines for cleavage may be formed parallel to the short sides, in the width dimension of the sapphire substrate 10.

Further, at least one other line for cleavage (not shown) other than the lines for cleavage 52, 54 may be additionally formed on the bottom r-face 12 of the substrate 10 in the (11-22)-plane direction of the substrate 10 along the guide line.

By weakening the bottom r-face 12 of the sapphire substrate 10 by the lines for cleavage 52, 54 in the (11-22)-plane direction of the sapphire substrate 10, on which the lines for cleavage 52, 54 are formed, cleavage of the bottom r-face 12 of the sapphire substrate 10 may be controlled and is reproducible.

In accordance with an embodiment, the aforementioned lines for cleavage 52, 54 may be formed by scribing the bottom r-face 12 of the sapphire substrate 10 in the (11-22)-plane direction of the sapphire substrate 10. For example, as shown in FIG. 4B, the bottom r-face 12 of the sapphire substrate 10 may be scribed along a line defining a diameter of the sapphire substrate 10 to form the line for cleavage 52. Namely, the line for cleavage 52 may extend the diameter of the sapphire substrate 10. A suitable tool for forming the scribe line is a Loomis Model LCD-1 Cleaver/Scriber, which is commercially available from Loomis Industries, 1204 Church Street, St. Helena, Calif. 94574. The scribe pressure may range from about 0 psi to about 120 psi. For example, the scribe pressure is from about 4 psi to about 8 psi. The scribing process may be repeated to form any desired number of lines for cleavage.

Another suitable technique for forming the lines for cleavage on the bottom r-face 12 of the sapphire substrate 10 in the (11-22)-plane direction of the sapphire substrate 10 is laser ablation. Laser ablation may remove the material, of which the sapphire substrate 10 is formed, in the (11-22)-plane direction to form lines for cleavage 52, 54. Short-wavelength, pulsed excimer lasers, mode-locked Nd:YAG lasers, or far-infrared $CO_2$ lasers may emit an optical beam that may be focused to a small spot size. When the laser light is absorbed in the sapphire substrate 10, the sapphire substrate 10 is locally heated and the material from the sapphire is removed. This process is also known as the laser ablation. As the laser pulses are very short (few tens of ns), the heating occurs only locally and does not affect the zone surrounding the ablated region. To form a narrow groove or trench for the lines for cleavage 52, 54, the laser is focused to a very small spot size, typically in the order of a few microns. The minimum spot size determines the width of the groove or trench.

By rastering the focused laser beam along the sapphire substrate 10, trenches or grooves are formed to create the line for cleavage on the bottom r-face 12 of the sapphire substrate 10. The depth of the groove or trench may have at least the same size as the width, but may be larger than the width. The depth of the trench or groove is typically in the order of several microns or several tens of microns.

In addition, the bottom r-face 12 of the sapphire substrate 10 may be etched in the (11-22)-plane direction of the sapphire substrate 10 by any suitable etching technique, in order to form the lines for cleavage 52, 54. Although it is difficult to etch through the entire thickness of the sapphire substrate 10, shallow grooves, trenches or other like configuration may be formed as the line for cleavage, by etching a part of the sapphire substrate 10 in the (11-22)-plane direction of the sapphire substrate 10, not by etching the entire sapphire substrate 10. For example, dry etching techniques, such as $Cl_2$/$BCl_3$ based reactive ion beam etching (RIE) may be used for forming the lines for cleavage 52, 54. Such techniques may form grooves or the like as the lines for cleavage 52, 54 on the bottom r-face 12 of the sapphire substrate 10 having a depth of less than about 1 µm, which is typically sufficient for cleaving the substrate 10. The width of the groove, trench or the like for the line for cleavage may be defined by a photoresist or metal-mask (e.g., Ni) pattern used in the etching process and is typically in the order of several microns.

After forming the lines for cleavage 52, 54 as aforementioned, a force is then applied to the bottom r-face 12 of the sapphire substrate 10 to cleave the sapphire substrate 10 along the lines for cleavage 52, 54 in the (11-22)-plane direction and also to cleave the at least one compound semiconductor layer 20 in the c-plane direction, as shown in FIG. 4C. Thus, a cleaved face may be formed along the c-plane of the at least one compound semiconductor layer 20.

Figure 5A:
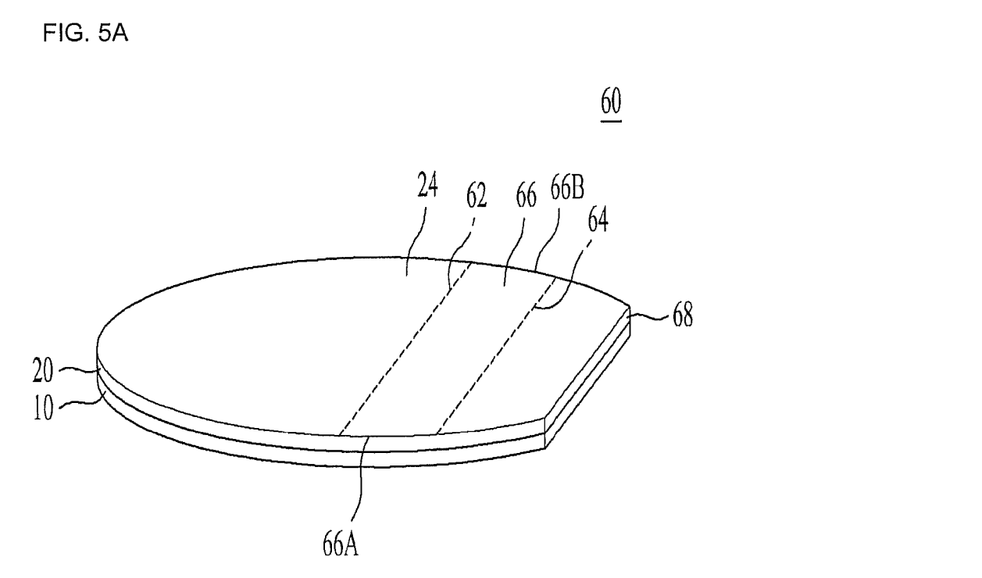
FIGS. 5A to 5C illustrate the drawings for explaining the method for forming a cleaved facet of a semiconductor device in accordance with another embodiment.
Figure 5B:
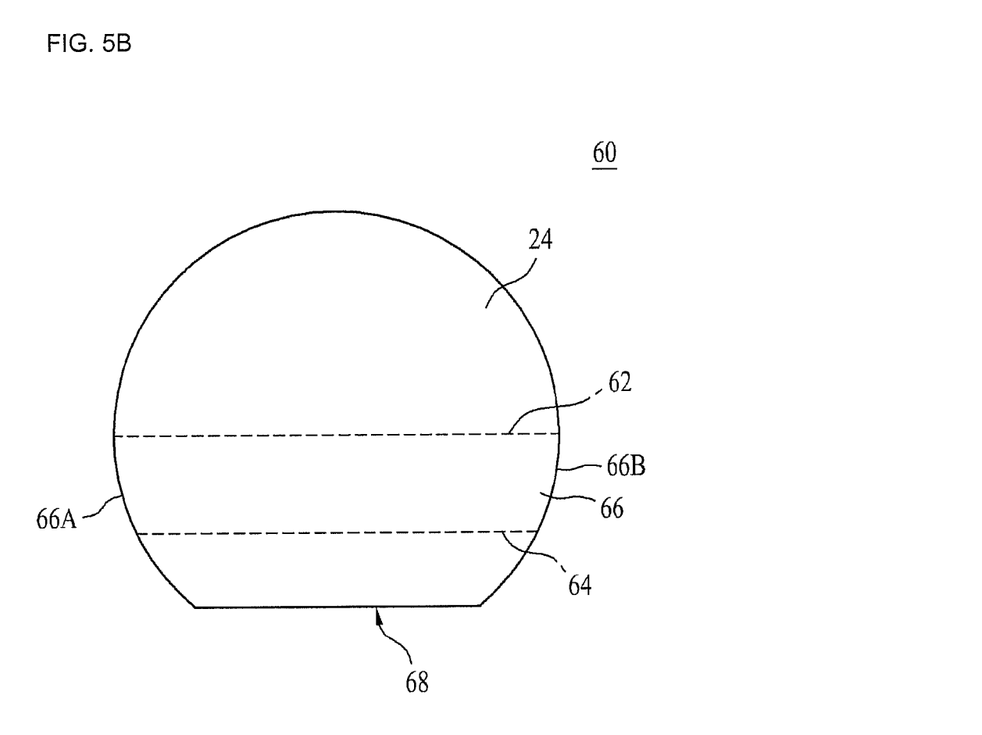
Figure 5C:
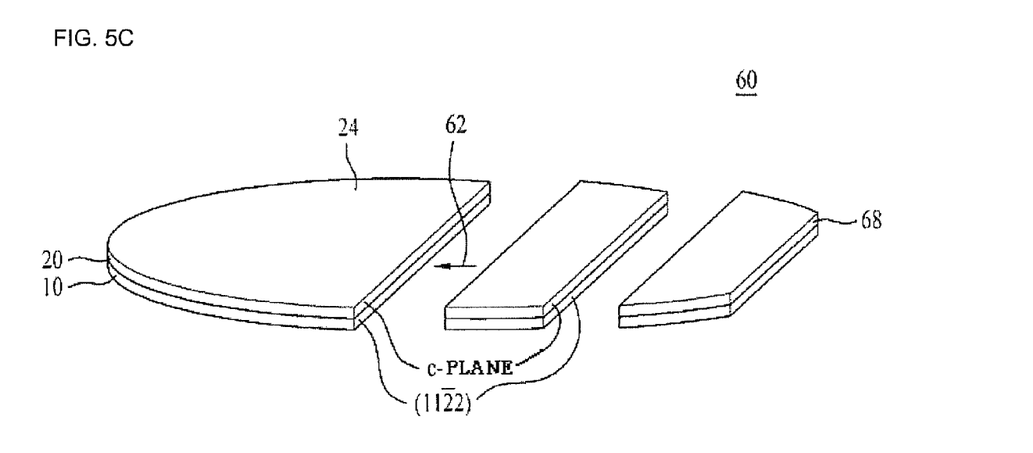

FIGS. 5A to 5C illustrate the drawings for explaining the method for forming a cleaved facet of a semiconductor device in accordance with another embodiment. In detail, FIG. 5A illustrates a perspective view of the semiconductor device 60 in which lines for cleavage 62, 64 are formed. FIG. 5B illustrates a plan view of the compound semiconductor layer 20 in which lines for cleavage 62, 64 are formed. FIG. 5C illustrates a perspective view of the semiconductor device 60 cleaved along the lines for cleavage 62, 64.

FIG. 1 is a cross-sectional view of the semiconductor device 60 of FIG. 5C seen from the arrow 62. The semiconductor device 60 used in embodiments of this invention may have other shapes such as polygon shapes as well as the circular shape shown in FIGS. 5A to 5C, and include the c-plane flat 68.

In accordance with another embodiment, referring to FIGS. 1, 5A, and 5B, the lines for cleavage 62, 64 are formed along a length of a guide line on a top surface 24 of the at least one compound semiconductor layer 20. Here, the guide line means a line extending in an c-plane direction of the at least one compound semiconductor layer 20. Also, the guide line means a line extending from one portion 66A of an edge 66 to another portion 66B of the edge 66, the edge 66 being disposed between the top surface 24 and the bottom surface 22 of the at least one compound semiconductor layer 20. In embodiments, the lines for cleavage 62, 64 (as well as other lines for cleavage that are not shown) may extend at least about 95% of an entire length of the guide line, the entire length being the distance between opposed portions 66A, 66B of the edge 66 of the at least one compound semiconductor layer 20. Alternatively, the lines for cleavage 62, 64 may extend the entire length of the guide line, as shown in FIGS. 5A and 5B.

Further, the lines for cleavage 62, 64 may be formed by scribing, ablating, or etching the top surface 24 of the at least one semiconductor layer 20 in the c-plane direction of the at least one compound semiconductor layer 20, as shown in FIG. 5A and 5B. The scribe, ablation, or etching process is the same as the aforementioned process which is used for forming the lines for cleavage 52, 54 shown in FIGS. 4A and 4B. Therefore, the explanation of the scribe, ablation, or etching process for forming of the lines for cleavage 62, 64 is omitted.

If the at least one compound semiconductor layer 20 have a circular configuration and a diameter as shown in FIGS. 5A and 5B, the line for cleavage 62 extends substantially the entire diameter of the compound semiconductor layer 20. And, the line for cleavage 64 may extend parallel to the line for cleavage 62 and have a length that is less than the entire diameter of the compound semiconductor layer 20.

If the compound semiconductor layer 20 has a polygon shape, unlike the circular shape as shown in FIGS. 5A and 5B, the compound semiconductor layer 20 has any edge 66. In this case, the lines for cleavage 62, 64 may extend from one portion of an edge to another portion of the edge of the compound semiconductor layer 20 in the c-plane direction. For a rectangular-shaped compound semiconductor layer 20 having short sides parallel to the c-plane, a plurality of lines for cleavage may be formed parallel to the short sides, in the width dimension of the compound semiconductor layer 20.

Further, at least one other line for cleavage (not shown) other than the lines for cleavage 62, 64 may be additionally formed on the top surface 24 of the compound semiconductor layer 20 in the c-plane direction of the compound semiconductor layer 20 along the guide line.

By weakening the top surface 24 of the compound semiconductor layer 20 by the lines for cleavage 62, 64 in the c-plane direction of the compound semiconductor layer 20 on which the lines for cleavage 62, 64 are formed, the cleavage of the top surface 24 of the compound semiconductor layer 20 may be controlled and is reproducible.

After forming the lines for cleavage 62, 64 as aforementioned, a force is then applied to the top surface 24 of the compound semiconductor layer 20 to cleave the compound semiconductor layer 20 along the lines for cleavage 62, 64 in the c-plane direction and also to cleave the sapphire substrate along the (11-22)-plane, as shown in FIG. 5C. Thus, a cleaved face may be formed along the c-plane of the at least one compound semiconductor layer 20.

As shown in FIG. 4C or FIG. 5C, the cleaved face formed along the c-plane of the compound semiconductor layer 20 may be aligned on the same the horizontal surface as the (11-22)-plane of the sapphire substrate 10. If a plurality of the compound semiconductor layer 20 is formed on the sapphire substrate 10 in the stack structure, each of the cleaved facets is formed with extending along the c-plane of the compound semiconductor layer 20. For this, the processes for cleaving the compound semiconductor layer 20 and the sapphire substrate 10 may be repetitively performed.

For example, the pressure applied to the lines for cleavage 52, 54, 62, 64 may typically be from about 10 psi to about 20 psi to cause cleavage of the sapphire substrate 10 and the compound semiconductor layer 20.

The cleaved facet formed in the c-plane direction of the compound semiconductor layer 20 may be at least substantially perpendicular to the top r-face 14 of the sapphire substrates 10. Thus, since the cleaved facet is formed on the compound semiconductor layer 20, the laser diodes formed on the top r-face 14 of the sapphire substrate 10 may have a satisfactory far-field light pattern for various applications, and be applied for optical information storage and printing.

Methods according to the embodiments may simultaneously or sequentially cleave the compound semiconductor layer 20 and the sapphire substrate 10 in the aforementioned semiconductor device 50, 60.

The compound semiconductor layer 20 have an rms (root mean square) roughness of from about 0.0001 Å to about 200 Å. For example, the roughness may be 100 Å.

Since the sapphire substrate 10 is cleaved along the lines for cleavage 52, 54 as shown in FIG. 4C, or the compound semiconductor layer 20 is cleaved along the lines for cleavage 62, 64 as shown in FIG. 5C, the even cleaved facet may be formed in the compound semiconductor layer 20. Namely, the compound semiconductor layer 20 is formed on the top r-face 14 of the sapphire substrate 10, and then the lines for cleavage 52, 54, 62, 64 are formed, and then the sapphire substrate 10 and the compound semiconductor layer 20 are cleaved along the line for cleavage 52, 54, 62, 64, thereby forming the even mirror facet in the c-plane of the compound semiconductor layer 20. Therefore, since the reflectivity of the cleaved facet may be improved and the loss of reflectivity may be suppressed, the semiconductor device such as the semiconductor laser or light emitting diode may have a low-threshold current density, low energy loss, long lifespan.

The above-described method may form the cleaved facets for the plurality of light emitting device on the top r-face 14 of the sapphire substrate 10. For example, for a two-inch diameter sapphire substrate 10, thousands of light emitting devices, such as laser diodes or LEDs, may be formed. For example, light emitting devices may be formed at a spacing of about 500 μm from each other.

When the scribing technique is used to form lines for cleavage, the scribing process may be automated to increase process output and efficiency. Ablation or etching techniques may also be used to automatically produce large numbers of light emitting devices on a single sapphire substrate 10.

Methods according to the aforementioned embodiment may be used to form various semiconductor structures that include the at least compound semiconductor layer 20 disposed on the sapphire substrates 10. As stated, methods according to the embodiment may be used for forming the semiconductor device such as the light emitting device. In this case, the cleaved facets of the compound semiconductor layer 20 may be at least substantially perpendicular to the r-face of the sapphire substrate 10, and also have a suitable roughness to satisfy the light emitting efficiencies of the light emitting device.

Hereinafter, the light emitting device fabricated by using the method according to the aforementioned embodiments is described with the attached drawings.

Figure 6:
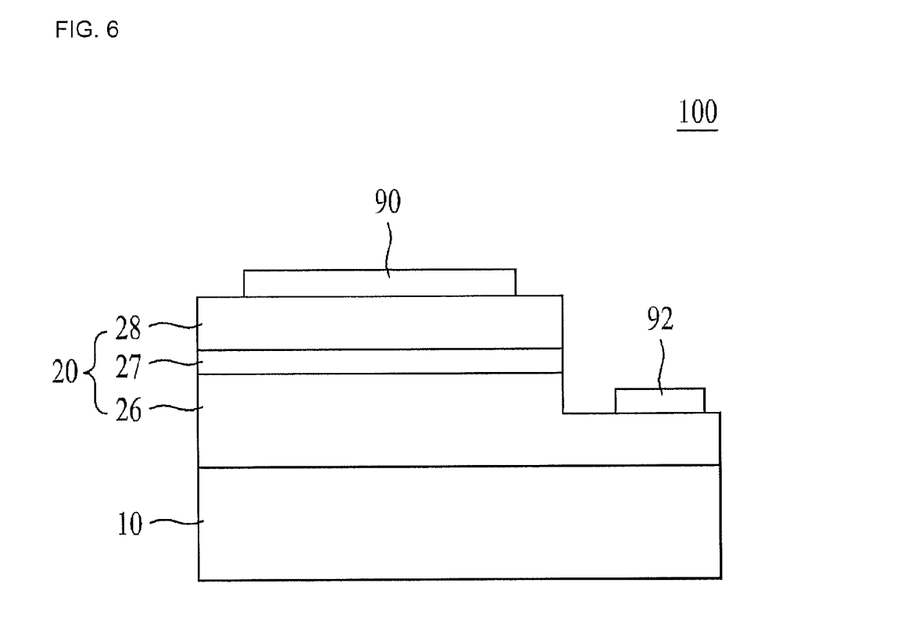
FIG. 6 illustrates a cross-sectional view of the light emitting device in accordance with the embodiment.

FIG. 6 illustrates a cross-sectional view of the light emitting device 100 in accordance with the embodiment.

The light emitting device 100 of FIG. 6 includes a substrate 10, the light emitting structure 20, a first electrode 90, and a second electrode 92.

The substrate 10 shown in FIG. 6 corresponds to the substrate 10 shown in FIG. 1, and the light emitting structure shown in FIG. 6 corresponds to the compound semiconductor layer 20 shown in FIG. 1. The material of the substrate 10 may be insulating material, semiconductor material, or metal material which is suitable for semiconductor growth. For example, the substrate 10 is formed of at least one of sapphire $Al_2O_3$, GaN, ZnO, Si, GaP, InP, $Ga_2O_3$, or GaAs.

The light emitting structure 20 is disposed on the top r-face of the substrate 10. The light emitting structure 20 includes a first conduction type semiconductor layer 26, an active layer 27, and a second conduction type semiconductor layer 28. Each of the first conduction type semiconductor layer 26, the active layer 27, and the second conduction type semiconductor layer 28 may include, but not limited to, one layer or multiple layers.

The first conduction type semiconductor layer 26 may be formed of a compound semiconductor, e.g., of a group III-V nitride compound semiconductor and doped with first conduction type dopant. For example, the first conduction type semiconductor layer 26 may be formed of a semiconductor material having composition of $Al_xIn_yGa_{(1-x-y)}N$ ($0 \leq x \leq 1$, $0 \leq y \leq 1$, $0 \leq x+y \leq 1$), or at least one selected from GaN, InN, AlN, InGaN, AlGaN, InAlGaN, AlInN, AlGaAs, InGaAs, AlInGaAs, GaP, AlGaP, InGaP, AlInGaP, and InP. If the first conduction type semiconductor layer 26 is an N type semiconductor layer, the first conduction type dopant may include, but not limited to, Si, Ge, Sn, Se, or/and Te as an N type dopant.

The active layer 27 is disposed on the first conduction type semiconductor layer 26. The active layer 27 emits a light having energy fixed by an energy band unique to a material of the active layer 27 as electrons(or, holes) injected thereto through the first conduction type semiconductor layer 26 and holes(or, electrons) injected thereto through the second conduction type semiconductor layer 28 meet.

The active layer 27 may include at least one of a double hetero structure, a multi-hetero structure, a single quantum well structure, a MQW (Multi Quantum Well) structure, a Quantum-Wire structure, or a Quantum dot structure. For example, the active layer 27 may be formed as the MQW (Multi Quantum Well) structure by injection of, but not limited to, TMGa gas, $NH_3$ gas, $N_2$ gas, and TMIn gas.

The active layer 27 may have a pair structure of well layer/barrier layers constructed of at least any one of, but not limited to, InGaN/GaN, InGaN/InGaN, GaN/AlGaN, InAlGaN/GaN, GaAs(InGaAs)/AlGaAs, or GaP(InGaP)/AlGaP. The well layer may be formed of a material having a band-gap narrower than a band-gap of the barrier layer.

There may be a conductive clad layer (Not shown) disposed on or/and underside of the active layer 124. The conductive clad layer may be formed of a semiconductor to have an energy band-gap wider than the energy band-gap of the barrier layer of the active layer 27. For example, the conductive clad layer may include GaN, AlGaN, InAlGaN, or supper-lattice structure. Further, the conductive clad layer may be doped with N type or P type dopant.

The second conduction type semiconductor layer 28 may be disposed on the active layer 27. The second conductive type semiconductor layer 28 may be formed of a compound semiconductor, e.g., of a group III to V compound semiconductor doped with second conduction type dopant. For example, the second conduction type semiconductor layer 28 may be formed of a semiconductor material having composition of $In_xAl_yGa_{1-x-y}N$ ($0 \leq x \leq 1$, $0 \leq y \leq 1$, $0 \leq x+y \leq 1$), or at least one of GaN, InN, AlN, InGaN, AlGaN, InAlGaN, AlInN, AlGaAs, InGaAs, AlInGaAs, GaP, AlGaP, InGaP, AlInGaP, or InP. If the second conduction type semiconductor layer 28 is a P type semiconductor layer, the second conduction type dopant may be Mg, Zn, Ca, Sr, and Ba as a P type dopant.

In the aforementioned embodiment, the first conduction type semiconductor layer 26 may be embodied as an N type semiconductor layer, and the second conduction type semiconductor layer 28 may be embodied as a P type semiconductor layer. Alternatively, the first conduction type semiconductor layer 26 may be embodied as a P type semiconductor layer, and the second conduction type semiconductor layer 28 may be embodied as an N type semiconductor layer.

According to this, the light emitting structure 20 may be embodied as one of an N-P junction structure, a P-N junction structure, an N-P-N junction structure, or a P-N-P junction structure.

A first electrode 90 may be disposed on the second conduction type semiconductor layer 28. The second conduction type semiconductor layer 28, the active layer 27, and a part of the first conduction type semiconductor layer 26 are mesa etched and removed, thereby exposing a part of the first conduction type semiconductor layer 26. The second electrode 92 is disposed on the exposed first conduction type semiconductor layer 26.

Each of the first and second electrodes 90, 92 may be formed of metal. And, each of the first and second electrode 90, 92 may be formed of reflective electrode material having ohmic characteristics. For example, each of the first and second electrodes 90, 92 may be formed of one metal selected from a group including Al, Ti, Cr, Ni, Cu and Au, and an alloy of above metals. Each of the first and second electrodes 90, 92 may be include one layer or multiple layers.

Figure 7:
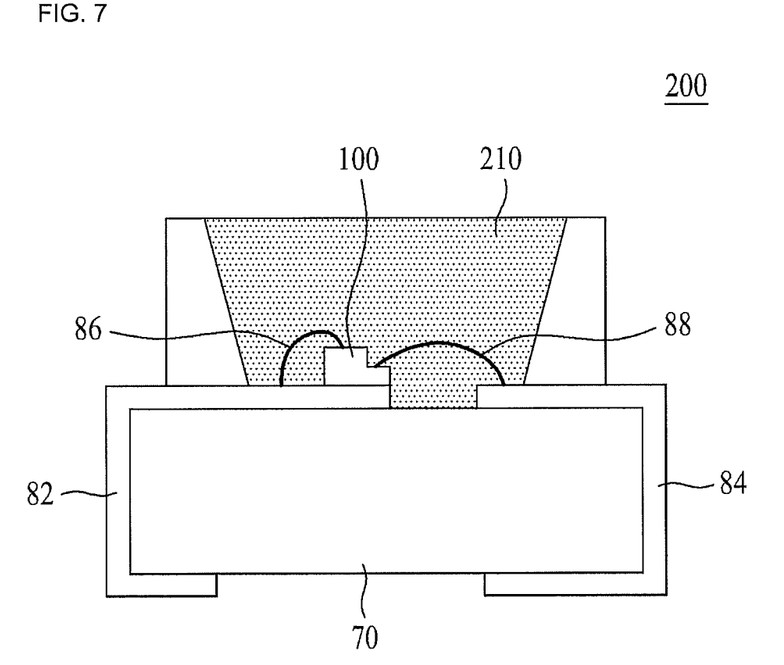
FIG. 7 illustrates a cross-sectional view of a light emitting device package in accordance with an embodiment.

FIG. 7 illustrates a cross-sectional view of a light emitting device package in accordance with an embodiment.

Referring to FIG. 9, the light emitting device package 200 includes a package body 70, a first lead frame 82, a second lead frame 84, a light emitting device 100, and a molded portion 210. The first and second lead frames 82, 84 are disposed on the package body 70. The light emitting device 100 is disposed on the package body 70 and electrically connected to the first and second lead frames 82, 84. The molded portion 210 covers the surface or lateral surfaces of the light emitting device 100. The light emitting device 100 corresponds to the light emitting device 100 of FIG. 6.

The package body 70 may be formed of silicon, synthetic resin, or metal, and have a sloped surface formed near the light emitting device 100 in order to enhance light extraction efficiency.

The first lead frame 82 and the second lead frame 84 are isolated from each other electrically, and provide power to the light emitting device 100. And, the first lead frame 82 and the second lead frame 84 may increase optical efficiency by reflecting the light emitted from the light emitting device 100, and may also dissipate heat generated from the light emitting device 100 to an outside of the light emitting device package.

The light emitting device 100 may be mounted on the package body 70, or on the first lead frame 82, or the second lead frame 84. The light emitting device 100 may be electrically connected to the first lead frame 82 and the second lead frame 84 by a wire bonding type, a flip chip type, or a die bonding type. In this embodiment, the light emitting device 100 is connected to the first lead frame 82 by the wire 86 and bonded to the second lead frame 84 by the wire 88.

The molded portion 210 may encompass and protect the light emitting device 100. The molded portion 210 includes the phosphor and vary the wavelength of light emitted from the light emitting device 100.

The light emitting device package 200 may have at least one of or a plurality of, but not limited to, the light emitting device 100 disclosed in any one of the above embodiments.

An array of the light emitting device packages of the embodiment may be on a substrate, and a light guide plate, a prism sheet, or a diffusion sheet, and the like that are optical members may be disposed on a light path of the light emitting device package. The light emitting device package, the substrate, and the optical members may function as a lighting unit. As another embodiment, a display device, an indicating device, or a lighting system may be produced, which includes the semiconductor light emitting device or the light emitting device package described in the foregoing embodiments, and the lighting system can include, for example, a lamp or a street light.

The method for forming the cleave facet of the semiconductor device in accordance with the embodiments may control and reproduce the cleavage of the bottom r-face 12 of the sapphire substrate 10 or of the top surface 24 of the compound semiconductor layer 20, thereby enabling laser diodes formed on the top r-face 14 of the sapphire substrate 10 to achieve satisfactory far-field patterns, making the laser diodes suitable for certain applications, such as printing applications or optical storage applications. Further, the method forms the cleaved even mirror facet in the c-plane direction of the compound semiconductor layer 20, thereby improving reflectivity of the cleaved facet and suppressing the reflective loss of the cleaved facet. Therefore, the method has the effects that the semiconductor devices such as semiconductor lasers or light emitting diodes have the low-threshold current density, low energy loss, long lifespan.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming a cleaved facet of a semiconductor device, the method comprising:
    forming at least one compound semiconductor layer on a top r-face of a substrate;
    forming a line for cleavage on a bottom r-face of the substrate along a length of a guide line,
        wherein the guide line extends in a (11-22)-plane direction of the substrate,
        wherein the guide line extends from one portion of an edge to another portion of the edge, and
        wherein the edge is disposed between the top r-face and the bottom r-face of the substrate, and
    applying a force to the bottom r-face of the substrate to cleave the substrate along the line for cleavage in the (11-22)-plane direction and to form a cleaved facet along a c-plane of the at least one compound semiconductor.

2. The method according to claim 1, wherein the forming of the line for cleavage comprising:
    weakening the bottom r-face of the substrate in the (11-22)-plane direction of the substrate, the line for cleavage being formed on the bottom r-face of the substrate.

3. The method according to claim 1, wherein the line for cleavage is formed by scribing the bottom r-face of the substrate in the (11-22)-plane direction of the substrate.

4. The method according to claim 1, wherein the line for cleavage is formed by ablating the bottom r-face of the substrate in the (11-22)-plane direction of the substrate.

5. The method according to claim 1, wherein the line for cleavage is formed by etching the bottom r-face of the substrate in the (11-22)-plane direction of the substrate.

6. The method according to claim 1, wherein the substrate is a sapphire substrate or spinel substrate.

7. The method according to claim 6, wherein the substrate has a thickness of 0.0001 to 300 µm.

8. The method according to claim 1, wherein the at least one compound semiconductor layer includes a group III-V nitride compound semiconductor.

9. The method according to claim 8, wherein the at least one compound semiconductor layer has at least one diode laser structure.

10. The method according to claim 8, wherein the at least one compound semiconductor layer has at least one light emitting diode structure.

11. The method according to claim 1, wherein the at least one compound semiconductor layer is grown on the top r-face of the substrate in a direction perpendicular to a a-plane of the at least one compound semiconductor layer.

12. The method according to claim 1, wherein the cleaved facet is formed on the at least one compound semiconductor layer in a direction perpendicular to the top r-face of the substrate.

13. The method according to claim 1, wherein the line for cleavage is formed along an entire length or along at least 95% of the entire length of the guide line.

14. The method according to claim 1, wherein the at least one compound semiconductor layer has an rms roughness of 0.0001 to 200 µm.

15. The method according to claim 1, wherein the at least one compound semiconductor layer and the substrate are simultaneously or sequentially cleaved.

* * * * *